(12) United States Patent  (10) Patent No.: US 7,697,319 B2
Dedieu et al.  (45) Date of Patent: Apr. 13, 2010

(54) NON-VOLATILE MEMORY DEVICE INCLUDING BISTABLE CIRCUIT WITH PRE-LOAD AND SET PHASES AND RELATED SYSTEM AND METHOD

(75) Inventors: Laurent Dedieu, Le Champ-Pres-Forges (FR); Sebastien Lefebvre, Montbonnot (FR)

(73) Assignee: STMicroelectronics, SA, Montrouge (FR)

( * ) Notice: Subject to any disclaimer, the term of this patent is extended or adjusted under 35 U.S.C. 154(b) by 378 days.

(21) Appl. No.: 11/706,865

(22) Filed: Feb. 14, 2007

(65) Prior Publication Data

US 2007/0211520 A1  Sep. 13, 2007

(30) Foreign Application Priority Data

Feb. 14, 2006 (FR) ................... 06 01292

(51) Int. Cl.
*G11C 11/00* (2006.01)

(52) U.S. Cl. ............... 365/154; 365/103; 365/104; 365/156; 327/217

(58) Field of Classification Search ............. 365/94, 365/103 X, 104 X, 154 O, 156 X, 103, 104, 365/154, 156; 327/217 X, 217
See application file for complete search history.

(56) References Cited

U.S. PATENT DOCUMENTS

| 4,146,802 | A | 3/1979 | Moench |
| 5,825,224 | A | 10/1998 | Klass |
| 6,028,435 | A | 2/2000 | Kong |
| 6,894,549 | B2 * | 5/2005 | Eliason ............ 327/217 |

OTHER PUBLICATIONS fFrench Search Report, FR 0601292, FA 679227, Nov. 7, 2006.

* cited by examiner

*Primary Examiner*—VanThu Nguyen
(74) *Attorney, Agent, or Firm*—Kevin D. Jablonski; Graybeal Jackson LLP

(57) ABSTRACT

An embodiment of a device for memorization of a memory bit is provided, comprising a bistable circuit having complementary first and second read/write terminals, wherein the device comprises an initialization input connected to said bistable circuit, said input being designed to go into a first state controlling a pre-load phase of said bistable circuit and following said preload phase, to go into a second state controlling setting up of said memory bit and its complement at said read/write terminals.

50 Claims, 4 Drawing Sheets

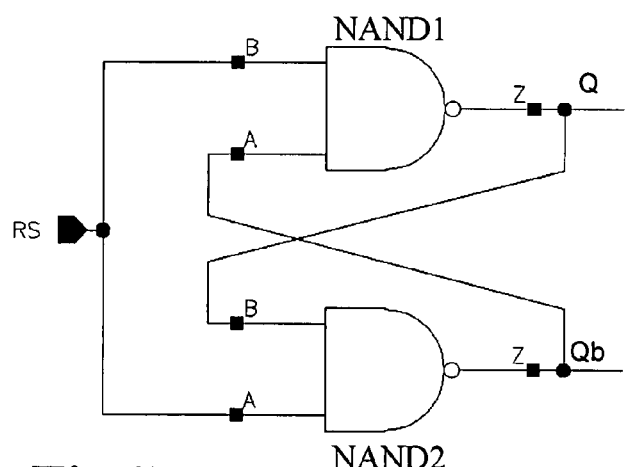
Fig.5
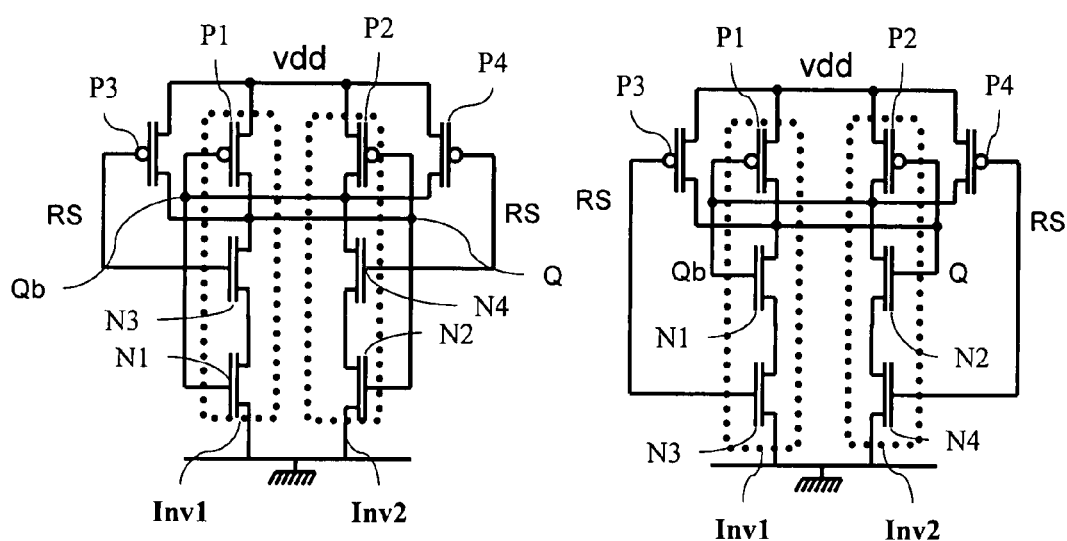
Fig.6  Fig.7

NON-VOLATILE MEMORY DEVICE INCLUDING BISTABLE CIRCUIT WITH PRE-LOAD AND SET PHASES AND RELATED SYSTEM AND METHOD

PRIORITY CLAIM

This application claims priority from French patent application No. 0601292 filed Feb. 14, 2006, which is incorporated herein by reference.

TECHNICAL FIELD

An embodiment of this invention relates to the field of non-volatile memories in general and to the structure of memory cells of this type in particular.

BACKGROUND

FIG. 1 illustrates an example memory cell structure according to the state of the art. This memory cell comprises a bistable circuit 1 based on transistors made using the CMOS technology. This bistable circuit is typically composed of two cross coupled inverters Inv1 and Inv2, each inverter then forming a storage node and having complementary read/write terminals Q and Qb. Each storage node Inv1 and Inv2 is composed of an NMOS transistor N1 and N2 respectively, and a PMOS transistor P1 and P2 respectively.

The PMOS transistor of each storage node is programmable, such that the threshold voltage of one PMOS can be offset from the threshold voltage of the other PMOS, and consequently the threshold voltage of one inverter can be offset from the threshold voltage of the other. The two inverters having different threshold voltages, when the cell is loaded, one of the two inverters is thus designed to switch more quickly than the other so that, depending on the state of programming, the required logical information 1 or 0 can be picked up on terminal Q, and the complementary logical state is then reached on terminal Qb.

For example, consider the case in which the PMOS transistor P1 of inverter Inv1 is programmed such that its threshold voltage Vth1 is greater than the threshold voltage Vth2 of the PMOS transistor P2 of the inverter Inv2 (in this case we are referring to the absolute value, as is the case for the entire description given below). In this configuration, a reset phase is carried out when the voltage is applied, during which the two PMOS transistors P1 and P2 are made conducting while the two NMOS transistors N1 and N2 are blocked. However, considering that the threshold voltage Vth1 is chosen to be greater than the threshold voltage Vth2, the transistor P2 is faster and will change over before the other PMOS transistor such that terminal Q will change to "0" when the power supply Vdd is stabilized, while at the same time the complementary logical state "1" is reached on terminal Qb.

Similarly, if we choose Vth1<Vth2 after the pre-load phase as the power supply Vdd is increasing, the logical states "1" and "0" are reached on terminals Q and Qb respectively.

In this configuration, the memory cell is necessarily initialized during the power supply increase phase. Such an operation implies that some specific constraints have to be taken into account during the power supply increase phase, particularly concerning the power supply voltage set-up time. If the increase in the power supply voltage is too fast, the behaviour of the cell may be severely disturbed, so that the cell can even be initialized in the inverse manner to what is normally expected. Therefore, one operating mode of such memory cell implies a fairly slow increase in the power supply voltage, of the order of a few milliseconds.

Furthermore, another constraint to be taken into account relates to the size of transistors involved in these cells. More precisely, fairly large transistors have to be provided to overcome undesirable effects related to mismatches. Repeatability problems in the transistor manufacturing process can mean that MOS transistors designed to be strictly identical, actually have different characteristics, for example in terms of their gate length. By choosing large transistors, the variation of the gate length as a function of the total length then becomes too small to influence operation.

But although this choice makes the assembly more robust, it is made at the detriment of other necessities and particularly security, because due to their size, these memory cells are then easily identifiable within a circuit. They can then be unsuitable for some security applications.

SUMMARY

Therefore, one or more embodiments of this invention are intended to solve one or more of these disadvantages. An embodiment of the invention thus applies to a device for memorizing a memory bit comprising a bistable circuit with first and second complementary read/write terminals, wherein the device comprises an initialization input connected to said bistable circuit, said input being designed to go into a first state controlling a pre-load phase of said bistable circuit, and following said preload phase, to go into a second state controlling set-up of said memory bit and its complement at said read/write terminals.

The bistable circuit used for the memorization device according to an embodiment of the invention comprises:

first and second transistors connected between the ground and the first and second terminals respectively, the gates of which are connected to said first and second terminals respectively;

third and fourth transistors connected between the first and second terminals respectively and a power supply source, the gates of which are connected to the second and first terminals respectively.

The first and second transistors may be of the NMOS type and the third and fourth transistors may be of the PMOS type.

According to a first embodiment, the device comprises:

fifth and sixth transistors, connected between the ground and between the second and first terminals respectively, the gates of which are connected to the initialization input of said device;

seventh and eighth transistors connected between the first and second terminals and the third and fourth transistors respectively, the gates of which are connected to said initialization input of said device.

According to one variant of this first embodiment, the seventh and eighth transistors are connected alternately respectively between the third and fourth transistors and the power supply source respectively, their gate being connected to the initialization input of said device.

Advantageously, according to this first embodiment, the pairs of third and seventh transistors and of fourth and eighth transistors have different threshold voltages, said memory bit being set up as a function of the offset between said threshold voltages of said pairs.

According to a second embodiment, the device comprises:

fifth and sixth transistors connected between the first and second transistors respectively and between the first and second terminals respectively, the gates of which are connected to the initialization input of said device;

seventh and eighth transistors connected between the first and second terminals respectively and the power supply source and the gates of which are connected to said initialization input of said device.

According to one variant of this second embodiment, the fifth and sixth transistors are connected alternately between the first and second transistors respectively and the ground, their gate being connected to the reset input of said device.

Advantageously, according to this second embodiment, the pairs of first and fifth transistors and second and sixth transistors have different threshold voltages, said memory bit being set up as a function of the offset between said threshold voltages of said pairs.

The fifth and sixth transistors may be of the NMOS type and the seventh and eighth transistors may be of the PMOS type.

BRIEF DESCRIPTION OF THE DRAWINGS

These and other characteristics and advantages of one or more embodiments of this invention will become clearer after reading the following description given as an illustrative and non-limitative example and with reference to the appended figures, wherein:

FIG. 5 is a representation of a second embodiment of the memorization device;

FIG. 6 describes details of the structure of the memorization device according to the second embodiment;

FIG. 7 presents a variant of the structure illustrated in FIG. 6;

DETAILED DESCRIPTION

A device is proposed for memorization of a memory bit, provided with a bistable circuit with complementary read/write terminals, according to an embodiment of the invention. This memorization device thus has a structure similar to the structure already described with reference to FIG. 1, except that a specific input is designed to be connected to the memorization device, thus advantageously enabling the memorization device to be initialized independently of the power supply increase.

Figure 2:
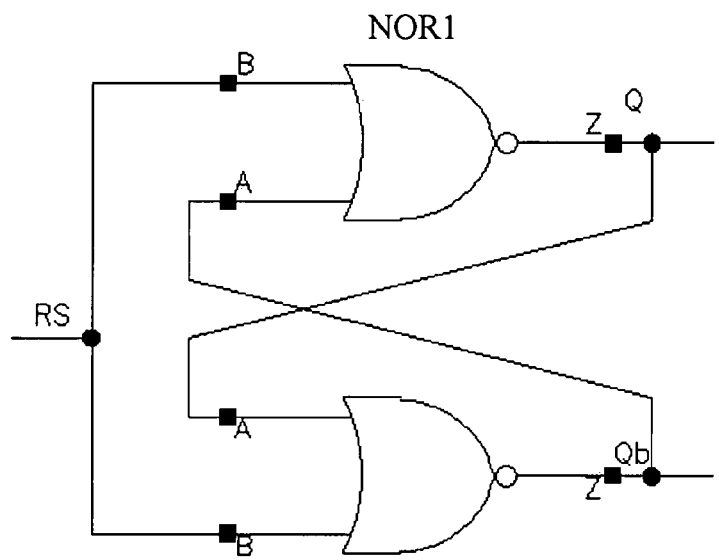
FIG. 2 is a representation of a first embodiment of a memorization device.

Examples of such memorization devices are illustrated in FIG. 2 and subsequent figures.

FIG. 2 illustrates a first embodiment of the invention. Therefore, the memorization device comprises a bistable circuit 1 with two complementary terminals Q and Qb. This figure illustrates memorization device with two standard NOR gates, NOR1 and NOR2 respectively. The outputs Q and Qb of each of the gates NOR1 and NOR2 are looped back onto the first input of gate NOR2 and gate NOR1 respectively.

Figure 3:
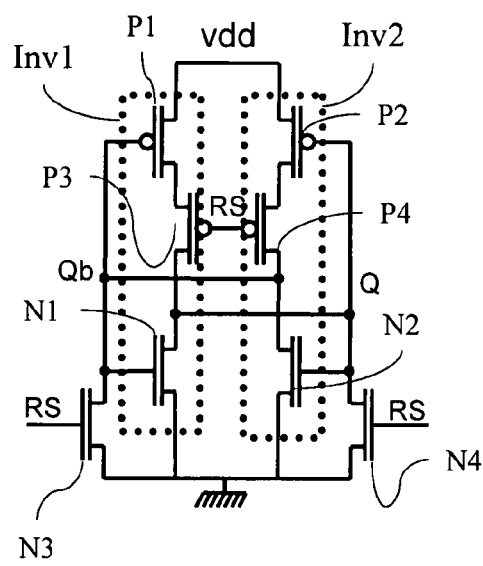
FIG. 3 describes details of the structure of the memorization device according to the first embodiment.

A specific input RS is then provided to initialize the device and is applied to the second input of each of the gates NOR1 and NOR2. Such a circuit then has two stable states and its operation will be described more specifically with reference to FIG. 3, illustrating the implementation of the logical functions in FIG. 2 using the CMOS technology.

Figure 1:
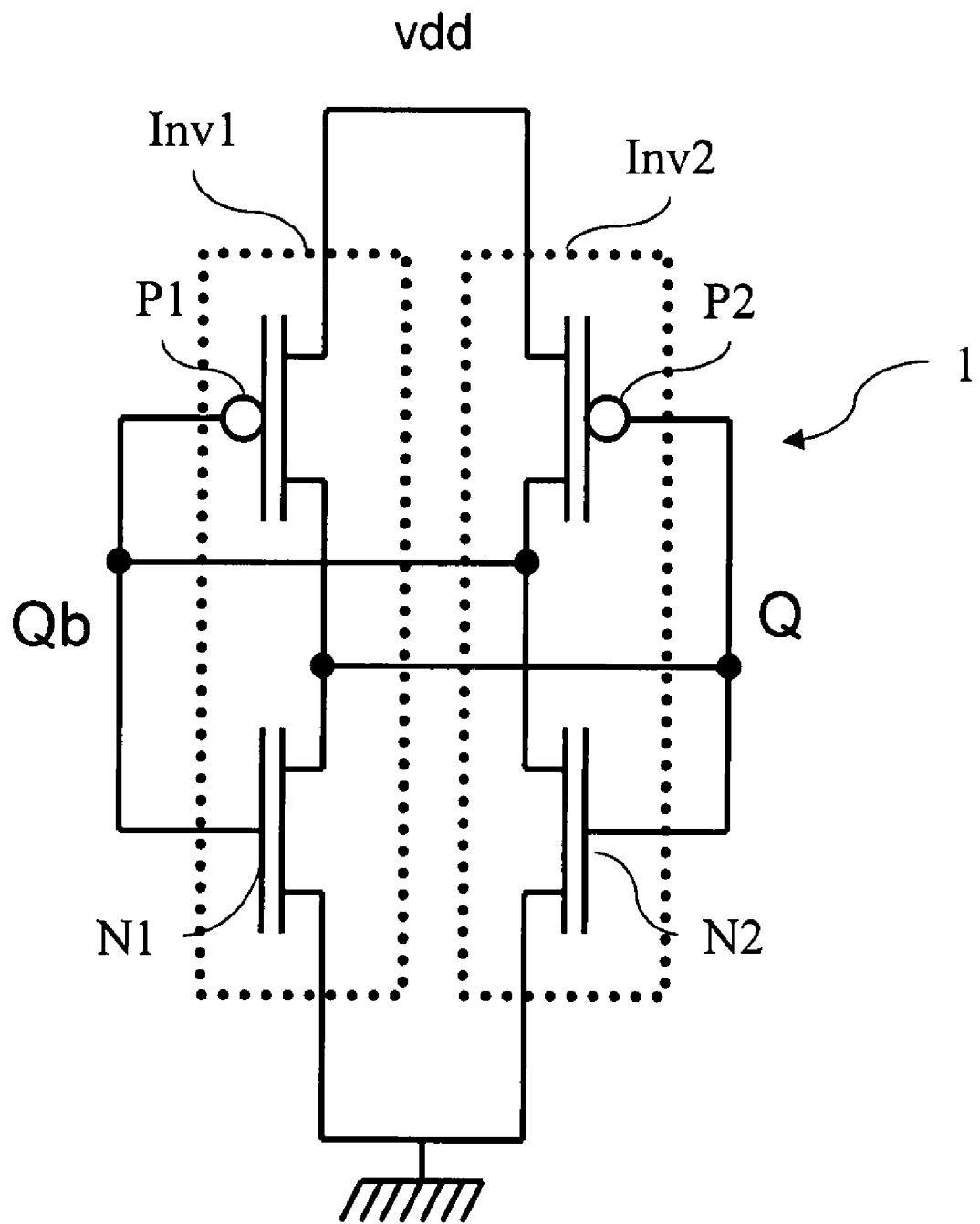
FIG. 1, already described, illustrates a memory cell according to the state of the art based on the combination of two cross-coupled CMOS inverters with different threshold voltages forming a bistable circuit that can be used in a memorization device according to an embodiment of the invention.

In particular, the structure of the bistable 1 may be as illustrated on FIG. 1. Thus elements in FIG. 3 in common with elements in FIG. 1 have the same references.

The memorization device according to this embodiment then includes the NMOS transistors N3 and N4 in addition to the elements already described, connected between the ground and between terminals Qb and Q respectively of the bistable circuit. The gates of these transistors N3 and N4 are connected to the input RS.

PMOS transistors P3 and P4 are also provided. They are connected between terminals Q and Qb respectively, and between the PMOS transistors P1 and P2 of each inverter Inv1 and Inv2 respectively. The gates of transistors P3 and P4 are each also connected to the initialization input RS.

Figure 8:
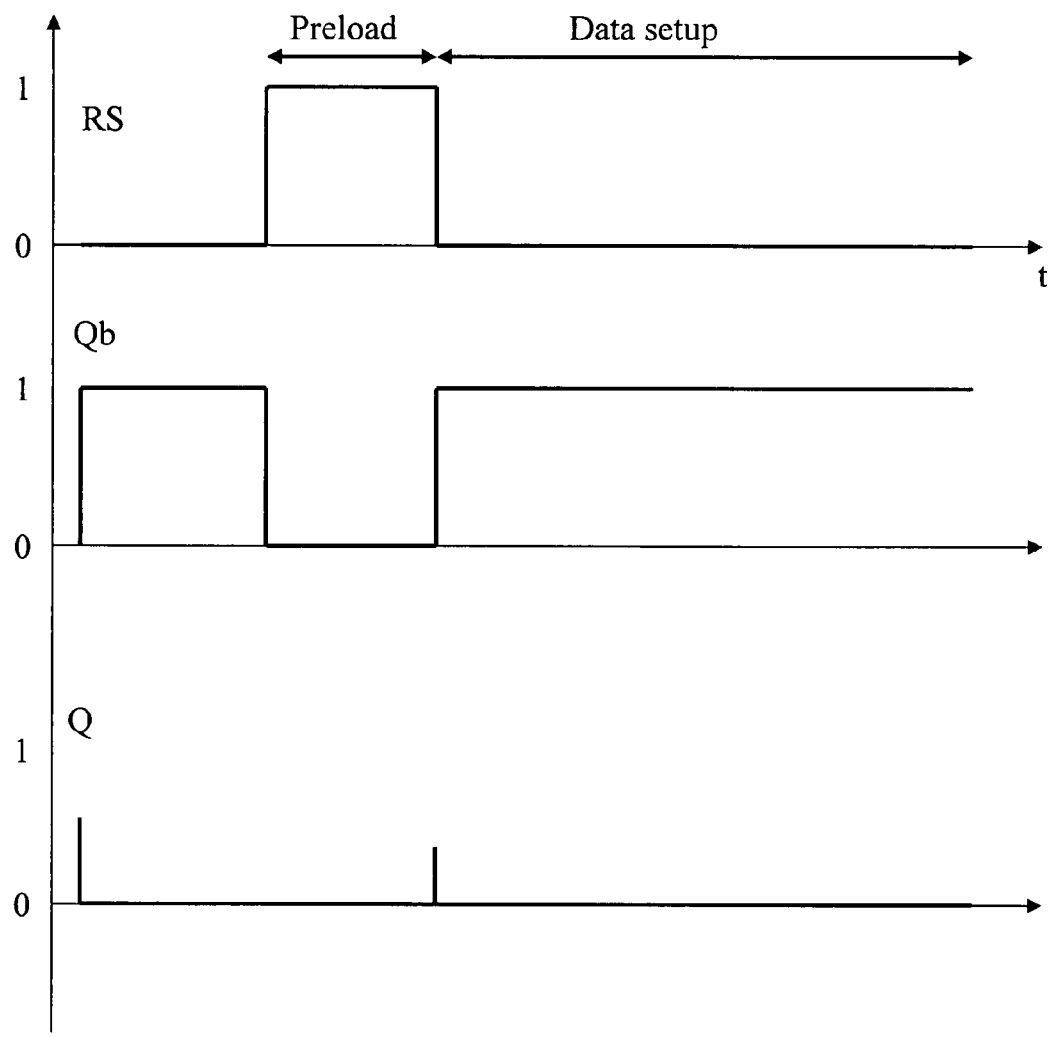
FIG. 8 illustrates a time diagram describing operation of the memory cell according to the first embodiment.

FIG. 8 illustrates the time diagrams of the signals on the RS input and on terminals Q and Qb of the device. Therefore, the RS input allows to initialize the device. Thus, when the input RS is set to the logical state "1", the two PMOS transistors P3 and P4 are cut off while the two NMOS transistors N3 and N4 are conducting. The terminals Q and Qb are then in the logical state "0".

The polarity of input RS is modified later, so as to change it to the low logical state "0". The two PMOS transistors P3 and P4 then become conducting while the NMOS transistors N3 and N4 are cut off. The terminals Q and Qb are no longer dependent on the RS control and will vary depending on the state of the four PMOS transistors P1, P2, P3 and P4 of the inverters Inv1 and Inv2, similarly as explained above with reference to FIG. 1.

Thus, in an example in which the threshold voltage Vth1 chosen for each of the transistors in the pair of transistors P1 and P3 of the inverter Inv1 is greater than the threshold voltage Vth2 chosen for each of the transistors in the pair of transistors P2 and P4 of the inverter Inv2, the final logical state "0" is reached on the terminal Q and the terminal Qb is set-up in the complementary logical state "1" as illustrated in FIG. 8, with Vdd equal to 1 volt.

On the contrary, if the threshold voltage Vth1 of the pair of transistors P1 and P3 of the inverter Inv1 is chosen to be less than then threshold voltage Vth2 of the pair of transistors P2 and P4 of the inverter Inv2, the final logical state "1" is reached on the terminal Q and the terminal Qb is equal to "0".

Therefore, in its first state, the input RS can be used to initialize the terminals Q and Qb independently of the rise of the power supply Vdd, by preloading them to "0" and once the power supply is fixed, the input RS is put into a second logical state to control setting up the final logical states at terminals Q and Qb, using the conventional configuration of the two inverters in FIG. 1 coupled with different threshold voltages.

Figure 4:
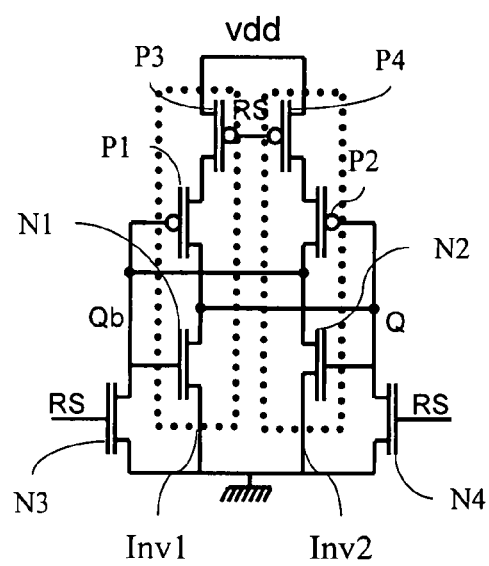
FIG. 4 presents a variant of the structure illustrated in FIG. 3.

FIG. 4 presents a variant of the structure illustrated in FIG. 3, in which the two PMOS transistor P3 and P4 controlled by the input RS are arranged differently. In this variant, the two PMOS transistors P3 and P4 are then connected between the PMOS transistor P1 and P2 respectively and the power supply source Vdd. Operation remains identical to operation described with reference to the structure in FIG. 3.

FIG. 5 shows a second embodiment of the memorization device. This figure illustrates the memorization device with two standard NAND gates, NAND1 and NAND2 respectively. The Q and Qb outputs of each of the gates NAND1 and NAND2 are looped back onto a first input of gate NAND2 and gate NAND1 respectively.

The common input RS designed to initialize the device is then applied to the second input of each of the gates NAND1 and NAND2. Operation will now be described with reference to FIG. 6, illustrating implementation of the logical functions in FIG. 5 using the CMOS technology.

Starting from the bistable circuit already described in FIG. 1, the NMOS transistor N3 in this embodiment is connected between the NMOS transistor N1 of the inverter Inv1 and terminal Q, and the NMOS transistor N4 is connected between the NMOS transistor N2 of the inverter Inv2 and terminal Qb. The gates of these transistors N3 and N4 are connected to the input RS.

The PMOS transistors P3 and P4 are connected between terminals Q and Qb and the power supply source Vdd respectively. Each of the gates of transistors P3 and P4 are also connected to the input RS.

In this configuration, instead of pre-loading the terminals Q and Qb to the logical state "0" as in the previous embodiment, they are preloaded to Vdd.

To achieve this, the input RS is placed in the logical state "0" for the preloading phase. Therefore the two NMOS transistors N3 and N4 are cut off, while the two PMOS transistors P3 and P4 are conducting, putting the terminals Q and Qb in the logical state "1".

Then, secondly, the polarity of the input RS is modified to be put in the logical state "1". The two PMOS transistors P3 and P4 are then cut off, while the NMOS transistors N3 and N4 become conducting. Therefore, the terminals Q and Qb are no longer dependent on the RS control and will change conventionally depending on the state of the four NMOS transistors N1, N2, N3 and N4 of the inverters Inv1 and Inv2. The threshold voltages of the NMOS transistors are adjusted for the circuit with the NAND gate.

Thus, in an example in which the threshold voltage Vth1 chosen for each of the transistors in the pair of transistors N1 and N3 of the inverter Inv1 is greater than the threshold voltage Vth2 chosen for each of the transistors in the pair of transistors N2 and N4 of the inverter Inv2, the final logical state "1" is reached on the terminal Q and the terminal Qb is set-up in the complementary logical state "0".

On the other hand, if the threshold voltage Vth1 of the transistors N1 and N3 of the inverter Inv1 is chosen to be less than the threshold voltage Vth2 of the transistors N2 and N4 of the inverter Inv2, the final logical state "0" is reached on the terminal Q and the terminal Qb is set-up in the complementary state "1".

FIG. 7 shows a variant of the structure illustrated on FIG. 6, in which the two NMOS transistors N3 and N4 controlled by the input RS are arranged differently. In this variant, the two NMOS transistors N3 and N4 are then connected between the transistors N1 and N2 and the ground respectively. Operation remains exactly the same as described with reference to the structure in FIG. 6.

Due to the input RS, the preloading phase of terminals Q and Qb is done independently of the power supply rise, guaranteeing that the memory cell initialization will not be disturbed by the power supply set-up conditions and particularly by its rate of increase.

Moreover, because only standard cells are used such as logical NOR gates or logical NAND gates, the memorization device is difficult to identify when it is integrated in a circuit, which is particularly advantageous in the context of security applications.

A cell may be programmed at the mask layout level. More particularly, the PMOS (or NMOS) transistors of the inverters are designed to be of a different type (one with a standard threshold voltage and the other with a high threshold voltage).

Programming may also be done in the manufacturing process, by modifying the threshold voltage of the PMOS (or NMOS) transistor of one of the inverters, for example with equipment used for an ebeam type implantation.

An integrated circuit, such as a memory, that includes one or more of the circuits of FIGS. 2-7 may be incorporated into a system, e.g., a computer system, cell-phone system, and automobile system.

From the foregoing it will be appreciated that, although specific embodiments of the invention have been described herein for purposes of illustration, various modifications may be made without deviating from the spirit and scope of the invention.

What is claimed is:

1. Device for memorizing a memory bit comprising a bistable circuit powered by a power supply voltage and with first and second complementary read/write terminals, a first transistor having a first threshold voltage, and a second transistor having a second threshold voltage that is different than the first threshold voltage, the device comprising an initialization input connected to said bistable circuit, said initialization input being designed to go into a first state controlling a pre-load phase of said bistable circuit and, following said preload phase, to go into a second state controlling the setting up of said memory bit and its complement at said read/write terminals, wherein during the second state the memory bit takes on a first value if the first threshold voltage is greater than the second threshold voltage, and takes on a second value if the second threshold voltage is greater than the first threshold voltage.

2. Device set forth in claim 1, wherein the bistable circuit comprises:
   the first and second transistors being connected between the ground and the first and second complementary read/write terminals respectively, the gates of which are connected to said first and second complementary read/write terminals respectively;
   third and fourth transistors connected between the first and second complementary read/write terminals respectively and the power supply source, the gates of which are connected to the second and first complementary read/write terminals respectively.

3. Device set forth in claim 2, wherein the first and second transistors are of the NMOS type, and in that the third and fourth transistors are of the PMOS type.

4. A device for memorizing a memory bit comprising a bistable circuit powered by a power supply voltage and with first and second complementary read/write terminals, the device comprising an initialization input connected to said bistable circuit, said initialization input being designed to go into a first state controlling a pre-load phase of said bistable circuit, and following said preload phase, to go into a second state controlling setting up of said memory bit and its complement at said read/write terminals, the device further comprising:
   first and second transistors connected between the ground and the first and second complementary read/write terminals respectively, the gates of which are connected to said first and second complementary read/write terminals respectively;
   third and fourth transistors connected between the first and second complementary read/write terminals respectively and the power supply source, the gates of which are connected to the second and first complementary read/write terminals respectively;
   fifth and sixth transistors, connected between the ground and between the second and first complementary read/write terminals respectively, the gates of which are connected to the initialization input of said device;

seventh and eighth transistors, connected between the first and second complementary read/write terminals respectively and the third and fourth transistors respectively, the gates of which are connected to said initialization input of said device.

5. Device set forth in claim 4, wherein the seventh and eighth transistors are connected alternately between the third and fourth transistors respectively and the power supply source, their gate being connected to the initialization input of said device.

6. Device set forth in claim 4, wherein the pairs of third and seventh transistors and fourth and eighth transistors have different threshold voltages, said memory bit being set up as a function of the offset between said threshold voltages of said pairs.

7. Device set forth in claim 2 further comprising:
fifth and sixth transistors, connected between the first and second transistors respectively and between the first and second terminals respectively, the gates of which are connected to the initialization input of said device;
seventh and eighth transistors, connected between the first and second terminals respectively and the power supply source and the gates of which are connected to said initialization input of said device.

8. Device set forth in claim 7, wherein the fifth and sixth transistors are connected alternately between the first and second transistors respectively and the ground, their gate being connected to the initialization input of said device.

9. Device set forth in claim 7, wherein the pairs of first and fifth transistors and second and sixth transistors have different threshold voltages, said memory bit being set up as a function of the offset between said threshold voltages of said pairs.

10. Device set forth in claim 4, wherein the fifth and sixth transistors are of the NMOS type and the seventh and eighth transistors are of the PMOS type.

11. A non-volatile memory cell, comprising:
a cell input node;
a first cell output node;
a first circuit operable to drive the first cell output node to a first logic level in response to a second logic level on the input node; and
a second circuit having a first transistor and operable, in response to the first logic level on the input node, to drive the first cell output node to the first logic level if a physical conduction characteristic of the first transistor has a first value and to drive the first cell output node to the second logic level if the physical conduction characteristic has a second value.

12. The non-volatile memory cell of claim 11 wherein:
the logic level on the first cell output node is complementary to the first logic level.

13. The non-volatile memory cell of claim 11 wherein:
the logic level on the first cell output node is equal to the first logic level.

14. The non-volatile memory cell of claim 11 wherein the first logic level is complementary to the fourth logic level.

15. The non-volatile memory cell of claim 11 wherein the level physical conduction characteristic includes a threshold voltage.

16. The non-volatile memory cell of claim 11, further comprising:
a supply node; and
wherein the first circuit comprises a switch having a control node coupled to the input node, a first conduction node coupled to the output node, and a second conduction node coupled to the supply node.

17. The non-volatile memory cell of claim 11 wherein the second circuit comprises:
a first inverter circuit having an inverter input node coupled to the cell output node and having an inverter output node; and
a second inverter circuit having an inverter input node coupled to the inverter output node of the first inverter circuit and having an inverter output node coupled to the first cell output node.

18. The non-volatile memory cell of claim 11 wherein the second circuit comprises:
a first inverter circuit having an inverter input node coupled to the cell output node, an inverter output node, and a first transconductance; and
a second inverter circuit having an inverter input node coupled to the inverter output node of the first inverter circuit, an inverter output node coupled to the first cell output node, and a second transconductance that is different from the first transconductance.

19. The non-volatile memory cell of claim 11 wherein the second circuit comprises:
a first inverter circuit having an inverter input node coupled to the cell output node, an inverter output node, and an inverter enable node coupled to the cell input node; and
a second inverter circuit having an inverter input node coupled to the inverter output node of the first inverter circuit, an inverter output node coupled to the first cell output node, and an inverter enable node coupled to the cell input node.

20. A non-volatile memory cell, comprising:
a cell input node;
a first cell output node;
a first circuit operable to drive the output node to a first logic level in response to a second logic level on the input node; and
a second circuit operable to drive the output node to a third logic level in response to a fourth logic level on the input node, the memory cell further comprising:
first and second supply nodes;
wherein the first circuit comprises a first transistor having a control node coupled to the cell input node, a first conduction node coupled to the cell output node, and a second conduction node coupled to the first supply node; and
wherein the second circuit comprises
a second transistor of a first type having a control node coupled to the cell output node, a first conduction node coupled to the first supply node, and a second conduction node,
a third transistor of a second type having a control node coupled to the cell output node, a first conduction node coupled to the second conduction node of the second transistor, and a second conduction node coupled to the second supply node;
a fourth transistor of the second type, serially coupled to the second and third transistors, and having a control node coupled to the cell input node,
a fifth transistor of the first type having a control node coupled to the second conduction node of the second transistor, a first conduction node coupled to the first supply node, and a second conduction node coupled to the cell output node,
a sixth transistor of the second type having a control node coupled to the control node of the fifth transistor, a first conduction node coupled to the second conduction node of the fifth transistor, and a second conduction node coupled to the second supply node, and a seventh transistor serially coupled to the fifth and sixth transistors and having a control node coupled to the cell input node.

21. A non-volatile memory cell, comprising:
a cell input node;
a first cell output node;
a first circuit operable to drive the output node to a first logic level in response to a second logic level on the input node; and
a second circuit operable to drive the output node to a third logic level in response to a fourth logic level on the input node, the memory cell further comprising:
first and second supply nodes;
wherein the first circuit comprises a first transistor having a control node coupled to the cell input node, a first conduction node coupled to the cell output node, and a second conduction node coupled to the first supply node; and
wherein the second circuit comprises
 a second transistor of a first type having a control node coupled to the cell output node, a first conduction node coupled to the first supply node, and a second conduction node,
 a third transistor of a second type having a control node coupled to the cell output node, a first conduction node coupled to the second conduction node of the second transistor, a second conduction node coupled to the second supply node, and a first threshold,
 a fourth transistor of the second type, serially coupled to the third and fourth transistors, having a control node coupled to the cell input node, and having a second threshold,
 a fifth transistor of the first type having a control node coupled to the second conduction node of the second transistor, a first conduction node coupled to the first supply node, and a second conduction node coupled to the cell output node,
 a sixth transistor of the second type having a control node coupled to the control node of the fifth transistor, a first conduction node coupled to the second conduction node of the fifth transistor, a second conduction node coupled to the second supply node, and a third threshold having a magnitude that is different than a magnitude of the first threshold, and
 a seventh transistor serially coupled to the fifth and sixth transistors, having a control node coupled to the cell input node, and having a fourth threshold having a magnitude that is different than a magnitude of the second threshold in manner that is similar to the manner in which the magnitude of the third threshold is different than the magnitude of the first threshold.

22. The non-volatile memory cell of claim 11, further comprising:
first and second supply nodes;
wherein the first circuit comprises a first PMOS transistor having a control node coupled to the cell input node, a first conduction node coupled to the cell output node, and a second conduction node coupled to the first supply node; and
wherein the second circuit comprises
 a second PMOS transistor having a control node coupled to the cell output node, a first conduction node coupled to the first supply node, and a second conduction node,
 a first NMOS transistor having a control node coupled to the cell output node, a first conduction node coupled to the second conduction node of the second PMOS transistor, and a second conduction node coupled to the second supply node;
 a second NMOS transistor, serially coupled to the second PMOS and first NMOS transistors, and having a control node coupled to the cell input node,
 a third PMOS transistor having a control node coupled to the second conduction node of the second PMOS transistor, a first conduction node coupled to the first supply node, and a second conduction node coupled to the cell output node,
 a third NMOS transistor having a control node coupled to the control node of the third PMOS transistor, a first conduction node coupled to the second conduction node of the third PMOS transistor, and a second conduction node coupled to the second supply node, and
 a fourth NMOS transistor serially coupled to the third NMOS and PMOS transistors and having a control node coupled to the cell input node.

23. A non-volatile memory cell, comprising:
a cell input node;
a first cell output node;
a first circuit operable to drive the output node to a first logic level in response to a second logic level on the input node; and
a second circuit operable to drive the output node to a third logic level in response to a fourth logic level on the input node, the memory cell further comprising:
first and second supply nodes;
wherein the first circuit comprises a first NMOS transistor having a control node coupled to the cell input node, a first conduction node coupled to the cell output node, and a second conduction node coupled to the first supply node; and
wherein the second circuit comprises
 a second NMOS transistor having a control node coupled to the cell output node, a first conduction node coupled to the first supply node, and a second conduction node,
 a first PMOS transistor having a control node coupled to the cell output node, a first conduction node coupled to the second conduction node of the second NMOS transistor, and a second conduction node coupled to the second supply node,
 a second PMOS transistor, serially coupled to the second NMOS and first PMOS transistors, and having a control node coupled to the cell input node,
 a third NMOS transistor having a control node coupled to the second conduction node of the second NMOS transistor, a first conduction node coupled to the first supply node, and a second conduction node coupled to the cell output node,
 a third PMOS transistor having a control node coupled to the control node of the third NMOS transistor, a first conduction node coupled to the second conduction node of the third NMOS transistor, and a second conduction node coupled to the second supply node, and
 a fourth PMOS transistor serially coupled to the third PMOS and NMOS transistors and having a control node coupled to the cell input node.

24. The non-volatile memory cell of claim 11, further comprising:
a second cell output node;
wherein the first circuit is operable to drive the second cell output node to a fourth logic level in response to the second logic level on the cell input node; and wherein the second circuit is operable to drive the second cell output node to a fifth logic level in response to the first logic level on the input node.

25. The non-volatile memory cell of claim 11, further comprising:
    a second cell output node;
    a supply node; and
    wherein the first circuit comprises
        a first switch having a control node coupled to the cell input node, a first conduction node coupled to the first cell output node, and a second conduction node coupled to the supply node, and
        a second switch having a control node coupled to the cell input node, a first conduction node coupled to the second cell output node, and a second conduction node coupled to the supply node.

26. The non-volatile memory cell of claim 11, further comprising:
    a second cell output node; and
    wherein the second circuit comprises
        a first inverter circuit having an inverter input node coupled to the first cell output node and having an inverter output node coupled to the second cell output node, and
        a second inverter circuit having an inverter input node coupled to the second cell output node and having an inverter output node coupled to the first cell output node.

27. The non-volatile memory cell of claim 11, further comprising:
    a second cell output node; and
    wherein the second circuit comprises
        a first inverter circuit having an inverter input node coupled to the first cell output node, an inverter output node coupled to the second cell output node, and a first transconductance, and
        a second inverter circuit having an inverter input node coupled to the second cell output node, an inverter output node coupled to the first cell output node, and a second transconductance that is different from the first transconductance.

28. The non-volatile memory cell of claim 11, further comprising:
    a second cell output node; and
    wherein the second circuit comprises
        a first inverter circuit having an inverter input node coupled to the first cell output node, an inverter output node coupled to the second cell output node, and an inverter enable node coupled to the cell input node, and
        a second inverter circuit having an inverter input node coupled to the second cell output node, an inverter output node coupled to the first cell output node, and an inverter enable node coupled to the cell input node.

29. A non-volatile memory cell, comprising:
    a cell input node;
    a first cell output node;
    a first circuit operable to drive the output node to a first logic level in response to a second logic level on the input node; and
    a second circuit operable to drive the output node to a third logic level in response to a fourth logic level on the input node, the memory cell further comprising:
    a second cell output node;
    first and second supply nodes;
    wherein the first circuit comprises
        a first transistor having a control node coupled to the cell input node, a first conduction node coupled to the first cell output node, and a second conduction node coupled to the first supply node, and
        a second transistor having a control node coupled to the cell input node, a first conduction node coupled to the second cell output node, and a second conduction node coupled to the first supply node; and
    wherein the second circuit comprises
        a third transistor of a first type having a control node coupled to the first cell output node, a first conduction node coupled to the first supply node, and a second conduction node coupled to the second cell output node,
        a fourth transistor of a second type having a control node coupled to the first cell output node, a first conduction node coupled to the second cell output node, and a second conduction node coupled to the second supply node,
        a fifth transistor of the second type, serially coupled to the third and fourth transistors, and having a control node coupled to the cell input node,
        a sixth transistor of the first type having a control node coupled to the second cell output node, a first conduction node coupled to the first supply node, and a second conduction node coupled to the first cell output node,
        a seventh transistor of the second type having a control node coupled to the second cell output node, a first conduction node coupled to the first cell output node, and a second conduction node coupled to the second supply node, and
        an eighth transistor serially coupled to the sixth and seventh transistors and having a control node coupled to the cell input node.

30. A non-volatile memory cell, comprising:
    a cell input node;
    a first cell output node;
    a first circuit operable to drive the output node to a first logic level in response to a second logic level on the input node; and
    a second circuit operable to drive the output node to a third logic level in response to a fourth logic level on the input node, the memory cell further comprising:
    a second cell output node;
    first and second supply nodes;
    wherein the first circuit comprises
        a first transistor having a control node coupled to the cell input node, a first conduction node coupled to the first cell output node, and a second conduction node coupled to the first supply node, and
        a second transistor having a control node coupled to the cell input node, a first conduction node coupled to the second cell output node, and a second conduction node coupled to the first supply node; and
    wherein the second circuit comprises
        a third transistor of a first type having a control node coupled to the first cell output node, a first conduction node coupled to the first supply node, and a second conduction node coupled to the second cell output node,
        a fourth transistor of a second type having a control node coupled to the first cell output node, a first conduction node coupled to the second cell output node, a second conduction node coupled to the second supply node, and a first threshold, a fifth transistor of the second type, serially coupled to the fourth and fifth transistors, having a control node coupled to the cell input node, and having a second threshold, a sixth transistor of the first type having a control node coupled to the second cell output node, a first conduction node coupled to the first supply node, and a second conduction node coupled to the first cell output node, a seventh transistor of the second type having a control node coupled to the second cell output node, a first conduction node coupled to the first cell output node, a second conduction node coupled to the second supply node, and a third threshold having a magnitude that is different than a magnitude of the first threshold, and an eighth transistor serially coupled to the sixth and seventh transistors, having a control node coupled to the cell input node, and having a fourth threshold having a magnitude that is different than a magnitude of the second threshold in manner that is similar to the manner in which the magnitude of the third threshold is different than the magnitude of the first threshold.

31. The non-volatile memory cell of claim 11, further comprising:

a second cell output node;
first and second supply nodes;
wherein the first circuit comprises
a first PMOS transistor having a control node coupled to the cell input node, a first conduction node coupled to the first cell output node, and a second conduction node coupled to the first supply node, and
a second PMOS transistor having a control node coupled to the cell input node, a first conduction node coupled to the second cell output node, and a second conduction node coupled the first supply node; and
wherein the second circuit comprises
a third PMOS transistor having a control node coupled to the first cell output node, a first conduction node coupled to the first supply node, and a second conduction node coupled to the second cell output node,
a first NMOS transistor having a control node coupled to the first cell output node, a first conduction node coupled to the second cell output node, and a second conduction node coupled to the second supply node;
a second NMOS transistor, serially coupled to the third PMOS and first NMOS transistors, and having a control node coupled to the cell input node,
a fourth PMOS transistor having a control node coupled to the second cell output node, a first conduction node coupled to the first supply node, and a second conduction node coupled to the first cell output node,
a third NMOS transistor having a control node coupled to the second cell output node, a first conduction node coupled to the first cell output node, and a second conduction node coupled to the second supply node, and
a fourth NMOS transistor serially coupled to the third NMOS and fourth PMOS transistors and having a control node coupled to the cell input node.

32. A non-volatile memory cell, comprising:
a cell input node;
a first cell output node;
a first circuit operable to drive the output node to a first logic level in response to a second logic level on the input node; and a second circuit operable to drive the output node to a third logic level in response to a fourth logic level on the input node, the memory cell further comprising:
a second cell output node;
first and second supply nodes;
wherein the first circuit comprises
a first NMOS transistor having a control node coupled to the cell input node, a first conduction node coupled to the first cell output node, and a second conduction node coupled to the first supply node, and
a second NMOS transistor having a control node coupled to the cell input node, a first conduction node coupled to the second cell output node, and a second conduction node coupled the first supply node; and
wherein the second circuit comprises
a third NMOS transistor having a control node coupled to the first cell output node, a first conduction node coupled to the first supply node, and a second conduction node coupled to the second cell output node,
a first PMOS transistor having a control node coupled to the first cell output node, a first conduction node coupled to the second cell output node, and a second conduction node coupled to the second supply node,
a second PMOS transistor, serially coupled to the third NMOS and first PMOS transistors, and having a control node coupled to the cell input node,
a fourth NMOS transistor having a control node coupled to the second cell output node, a first conduction node coupled to the first supply node, and a second conduction node coupled to the first cell output node,
a third PMOS transistor having a control node coupled to the second cell output node, a first conduction node coupled to the first cell output node, and a second conduction node coupled to the second supply node, and
a fourth PMOS transistor serially coupled to the third PMOS and fourth NMOS transistors and having a control node coupled to the cell input node.

33. The non-volatile memory cell of claim 11, further comprising:
a second cell output node;
wherein the first circuit is operable to drive the second cell output node to the first logic level in response to the second logic level on the cell input node; and
wherein the second circuit is operable to drive the second cell output node to the complement of the logic level on the first cell output node in response to the first logic level on the input node.

34. An integrated circuit, comprising:
an array of memory cells, at least one of the memory cells being a non-volatile memory cell including
a cell input node,
a first cell output node,
a first circuit operable to drive the first cell output node to a first logic level in response to a second logic level on the input node, and
a second circuit having a first transistor and operable, in response to the first logic level on the input node, to drive the first cell output node to the first logic level if a physical conduction characteristic of the first transistor has a first value and to drive the first cell output node to the second logic level if the physical conduction characteristic has a second value.

35. A system, comprising:
a first integrated circuit, comprising
an array of memory cells, at least one of the memory cells being a non-volatile memory cell including a cell input node,
a first cell output node,
a first circuit operable to drive the first cell output node to a first logic level in response to a second logic level on the input node, and
a second circuit having a first transistor and operable, in response to the first logic level on the input node, to drive the first cell output node to the first logic level if a physical conduction characteristic of the first transistor has a first value and to drive the first cell output node to the second logic level if the physical conduction characteristic has a second value; and
a second integrated circuit coupled to the first integrated circuit.

36. The system of claim 35 wherein the first and second integrated circuits are disposed on a same die.

37. The system of claim 35 wherein the first and second integrated circuits are disposed on respective dies.

38. The system of claim 35 wherein the second integrated circuit comprises a controller.

39. A method, comprising:
driving an input node of a non-volatile memory cell with a first logic level, the non-volatile memory cell having a first transistor;
causing a first output node of the non-volatile memory cell to have a second logic level in response to the first logic level on the input node;
driving the input node with the second logic level; and
in response to the second logic level on the input node, causing the first output node to have the first logic level if a physical conduction characteristic of the first transistor has a first value, or causing the first cell output node to have the second logic level if the physical conduction characteristic has a second value.

40. The method of claim 39 wherein the first logic level represents a data value stored in the non-volatile memory cell.

41. The method of claim 39 wherein the second logic level represents a data value stored in the non-volatile memory cell.

42. The method of claim 39, further comprising:
causing a second output node of the non-volatile memory cell to have the second logic level in response to the first logic level on the input node; and
in response to the second logic level on the input node, causing the second cell output node to have the second logic level if the physical conduction characteristic of the first transistor has the first value, or causing the second cell output node to have the first logic level if the physical conduction characteristic has a second value.

43. The method of claim 39, further comprising:
causing a second output node of the non-volatile memory cell to have the second logic level in response to the first logic level on the input node; and
in response to the second logic level on the input node, causing the second output node to have a logic level that is the complement of the logic level on the first cell output node.

44. A nonvolatile memory cell, comprising:
a cell input node;
first and second cell output nodes;
a first circuit operable to drive the first and second cell output nodes to a first logic level in response to a second logic level on the input node; and
a second circuit having a first transistor and operable to drive the first cell output node to the first or second logic level in response to the first logic level on the input node, the logic level on the first cell output node depending on a physical conduction characteristic of the first transistor.

45. The non-volatile memory cell of claim 44 wherein the second circuit is further operable to drive the second cell output node to the other of the first and second logic level in response to the first logic level on the input node, the logic level on the second cell output node depending on the physical conduction characteristic of the first transistor.

46. The non-volatile memory cell of claim 44 wherein the physical conduction characteristic of the first transistor includes a threshold voltage.

47. An integrated circuit, comprising:
an array of memory cells, at least one of the memory cells being a non-volatile memory cell including
a cell input node,
first and second cell output nodes,
a first circuit operable to drive the first and second cell output nodes to a first logic level in response to a second logic level on the input node, and
a second circuit having a first transistor and operable to drive the first cell output node to the first or second logic level in response to the first logic level on the input node, the logic level on the first cell output node depending on a physical conduction characteristic of the first transistor.

48. The integrated circuit of claim 47 wherein the physical conduction characteristic of the first transistor comprises a threshold voltage.

49. A system, comprising:
an integrated circuit, comprising
an array of memory cells, at least one of the memory cells being a non-volatile memory cell including
a cell input node,
first and second cell output nodes,
a first circuit operable to drive the first and second cell output nodes to a first logic level in response to a second logic level on the input node, and
a second circuit having a first transistor and operable to drive the first cell output node to the first or second logic level in response to the first logic level on the input node, the logic level on the first cell output node depending on a physical conduction characteristic of the first transistor.

50. The system of claim 49 wherein the physical conduction characteristic of the first transistor comprises a threshold voltage.

* * * * *

UNITED STATES PATENT AND TRADEMARK OFFICE
CERTIFICATE OF CORRECTION

PATENT NO. : 7,697,319 B2
APPLICATION NO. : 11/706865
DATED : April 13, 2010
INVENTOR(S) : Laurent Didieu and Sebastien Lefebvre It is certified that error appears in the above-identified patent and that said Letters Patent is hereby corrected as shown below:

Title page, item [54] and Col. 1, Title should read "NON-VOLATILE MEMORY DEVICE INCLUDING BISTABLE CIRCUIT WITH PRE-LOAD AND SETUP PHASES AND RELATED SYSTEM AND METHOD"

Signed and Sealed this

Twentieth Day of July, 2010

David J. Kappos
*Director of the United States Patent and Trademark Office*